(12) United States Patent
Cherekdjian

(10) Patent No.: US 8,558,195 B2
(45) Date of Patent: Oct. 15, 2013

(54) SEMICONDUCTOR STRUCTURE MADE USING IMPROVED PSEUDO-SIMULTANEOUS MULTIPLE ION IMPLANTATION PROCESS

(75) Inventor: Sarko Cherekdjian, Campbell, CA (US)

(73) Assignee: Corning Incorporated, Corning, NY (US)

( * ) Notice: Subject to any disclaimer, the term of this patent is extended or adjusted under 35 U.S.C. 154(b) by 250 days.

(21) Appl. No.: 12/950,416

(22) Filed: Nov. 19, 2010

(65) Prior Publication Data

US 2012/0126147 A1 May 24, 2012

(51) Int. Cl.
*A61N 5/00* (2006.01)

(52) U.S. Cl.
USPC .............. 250/492.2; 250/492.21; 438/513

(58) Field of Classification Search
USPC ....................................... 250/492.2
See application file for complete search history.

(56) References Cited

U.S. PATENT DOCUMENTS

| | | | | |
|---|---|---|---|---|
| 3,310,443 | A | 3/1967 | John et al. | 438/56 |
| 3,916,034 | A | 10/1975 | Tsuchimoto | 427/38 |
| 4,276,477 | A * | 6/1981 | Enge | 250/398 |
| 4,914,292 | A | 4/1990 | Tamai et al. | 250/251 |
| 5,189,303 | A | 2/1993 | Tanjyo et al. | 250/296 |
| 5,350,926 | A | 9/1994 | White et al. | 250/492.21 |
| 5,374,564 | A | 12/1994 | Bruel | 438/455 |
| 5,767,522 | A | 6/1998 | Kodama | 250/492.21 |
| 5,834,786 | A * | 11/1998 | White et al. | 250/492.21 |
| 5,854,123 | A | 12/1998 | Sato et al. | 438/507 |
| 5,966,620 | A | 10/1999 | Sakaguchi et al. | 438/455 |
| 5,985,742 | A | 11/1999 | Henley et al. | 438/515 |
| 6,010,579 | A | 1/2000 | Henley et al. | 148/33.2 |
| 6,013,563 | A | 1/2000 | Henley et al. | 438/458 |
| 6,027,988 | A | 2/2000 | Cheung et al. | 438/513 |
| 6,146,979 | A | 11/2000 | Henley et al. | 438/458 |

(Continued)

FOREIGN PATENT DOCUMENTS

| | | |
|---|---|---|
| JP | 53019759 | 2/1978 |
| JP | 11-329996 | 11/1999 |

(Continued)

OTHER PUBLICATIONS

F. Kroner, et al., "Phosphorus Ion Shower Implantation for Special Power IC Application," IEEE, 2000, pp. 476-479.

(Continued)

*Primary Examiner* — Phillip A Johnston
(74) *Attorney, Agent, or Firm* — Ryan T. Hardee

(57) ABSTRACT

Methods and apparatus provide for: a source simultaneously producing first plasma, which includes a first species of ions, and second plasma, which includes a second, differing, species of ions; an accelerator system including an analyzer magnet, which cooperate to simultaneously: (i) accelerate the first and second plasma along an initial axis, (ii) alter a trajectory of the first species of ions from the first plasma, thereby producing at least one first ion beam along a first axis, which is transverse to the initial axis, and (iii) alter a trajectory of the second species of ions from the second plasma, thereby producing at least one second ion beam along a second axis, which is transverse to the initial axis and the first axis; and a beam processing system operating to simultaneously direct the first and second ion beams toward a semiconductor wafer such that the first and second species of ions bombard an implantation surface of the semiconductor wafer to create an exfoliation layer therein.

20 Claims, 4 Drawing Sheets

(56) References Cited

U.S. PATENT DOCUMENTS

| | | | |
|---|---|---|---|
| 6,150,239 A | 11/2000 | Goesele et al. | 438/458 |
| 6,155,909 A | 12/2000 | Henley et al. | 451/39 |
| 6,160,262 A | 12/2000 | Aoki et al. | 250/492.21 |
| 6,162,705 A | 12/2000 | Henley et al. | 438/478 |
| 6,211,041 B1 | 4/2001 | Ogura | 438/458 |
| 6,245,645 B1 | 6/2001 | Mitani et al. | 438/455 |
| 6,251,754 B1 | 6/2001 | Ohshima et al. | 438/506 |
| 6,274,459 B1 | 8/2001 | Chan | 438/475 |
| 6,300,227 B1 | 10/2001 | Liu et al. | 438/513 |
| 6,303,468 B1 | 10/2001 | Aspar et al. | 438/455 |
| 6,312,797 B1 | 11/2001 | Yokokawa et al. | 428/336 |
| 6,331,227 B1 * | 12/2001 | Dykstra et al. | 156/345.29 |
| 6,344,404 B1 | 2/2002 | Cheung et al. | 438/513 |
| 6,350,702 B2 | 2/2002 | Sakaguchi et al. | 438/753 |
| 6,429,104 B1 | 8/2002 | Auberton-Herve | 438/527 |
| 6,458,671 B1 | 10/2002 | Liu et al. | 438/391 |
| 6,458,672 B1 | 10/2002 | Henley et al. | |
| 6,468,884 B2 | 10/2002 | Miyake et al. | 438/481 |
| 6,486,008 B1 | 11/2002 | Lee | 438/149 |
| 6,544,862 B1 | 4/2003 | Bryan | 438/455 |
| 6,548,382 B1 | 4/2003 | Henley | 438/526 |
| 6,566,233 B2 | 5/2003 | Yokokawa et al. | 438/455 |
| 6,597,039 B2 | 7/2003 | Ohmi et al. | 257/347 |
| 6,610,582 B1 | 8/2003 | Stewart | 438/455 |
| 6,613,678 B1 | 9/2003 | Sakaguchi et al. | 438/695 |
| 6,653,209 B1 | 11/2003 | Yamagata | 438/459 |
| 6,852,652 B1 | 2/2005 | Maa et al. | 438/933 |
| 6,927,148 B2 | 8/2005 | Ito | 8/458 |
| 7,176,528 B2 | 2/2007 | Couillard et al. | 257/347 |
| 7,323,398 B2 | 1/2008 | Akatsu | 438/458 |
| 7,326,628 B2 | 2/2008 | Mohamed et al. | 438/458 |
| 7,449,394 B2 | 11/2008 | Akatsu et al. | 438/458 |
| 7,456,080 B2 | 11/2008 | Gadkaree | 438/407 |
| 7,608,521 B2 | 10/2009 | Cites et al. | 438/455 |
| 7,759,657 B2 * | 7/2010 | Tieger et al. | 250/492.21 |
| 2002/0064924 A1 | 5/2002 | Cheung et al. | 438/400 |
| 2002/0100880 A1 | 8/2002 | Chen et al. | 250/492.21 |
| 2003/0183876 A1 | 10/2003 | Takafuji et al. | 257/347 |
| 2004/0038504 A1 | 2/2004 | Ito | 438/520 |
| 2004/0171196 A1 | 9/2004 | Walitzki | 438/137 |
| 2004/0171232 A1 | 9/2004 | Cayrefourcq et al. | 438/458 |
| 2004/0214434 A1 | 10/2004 | Atwater et al. | 438/689 |
| 2004/0229444 A1 | 11/2004 | Couillard et al. | 438/455 |
| 2004/0232488 A1 | 11/2004 | Forbes | 257/347 |
| 2005/0026426 A1 * | 2/2005 | Maleville et al. | 438/663 |
| 2005/0026650 A1 | 2/2005 | Russell | 106/22 |
| 2005/0032330 A1 | 2/2005 | Ghyselen et al. | 438/455 |
| 2005/0040073 A1 | 2/2005 | Cody et al. | 208/89 |
| 2005/0042842 A1 | 2/2005 | Lei et al. | 438/459 |
| 2005/0070071 A1 | 3/2005 | Henley et al. | 438/459 |
| 2005/0079664 A1 | 4/2005 | Faris | 438/200 |
| 2005/0085049 A1 | 4/2005 | Atwater, Jr. et al. | 438/455 |
| 2005/0098742 A1 | 5/2005 | Kellerman et al. | 250/492.21 |
| 2005/0196936 A1 | 9/2005 | Daval et al. | 438/455 |
| 2006/0038227 A1 | 2/2006 | Aitken et al. | 257/347 |
| 2007/0281440 A1 | 12/2007 | Cites et al. | 438/458 |
| 2011/0143512 A1 | 6/2011 | Wu et al. | 438/305 |

FOREIGN PATENT DOCUMENTS

| | | |
|---|---|---|
| WO | 2005/029576 | 3/2005 |
| WO | 2006/023289 | 3/2006 |
| WO | 2010/019968 | 8/2010 |

OTHER PUBLICATIONS

Agarwal et al., Efficient production of silicon-on-insulator films by co-implantation of He+ with H+, Applied Physics Letters, 1998, vol. 72, No. 9, pp. 1086-1088.

V. C. Venezia, et al, "The Role of Implantation Damage in the Production of Silicon-On-Insulator Films by Co-Implantation of He and H" Electrochemical Society Proceedings vol. 98-1 pp. 1385.

M. K. Weldon, et al, "Mechanism of silicon exfoliation induced by hydrogen/helium co-implantation", Applied Physics Letters vol. 73, No. 25, Dec. 21, 1998.

* cited by examiner

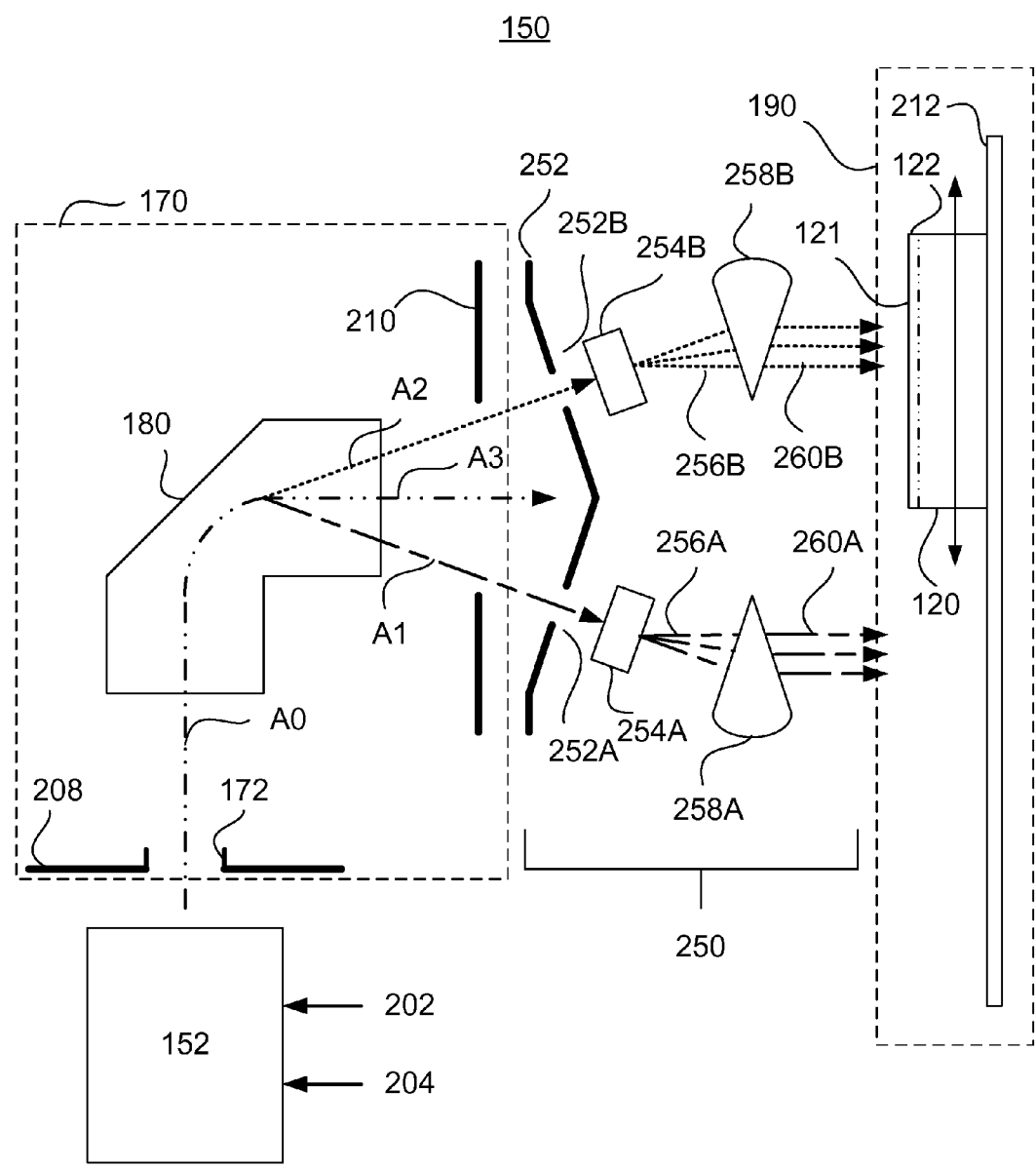

SEMICONDUCTOR STRUCTURE MADE USING IMPROVED PSEUDO-SIMULTANEOUS MULTIPLE ION IMPLANTATION PROCESS

BACKGROUND

The features, aspects and embodiments disclosed herein relate to the manufacture of semiconductor devices, such as semiconductor-on-insulator (SOI) structures, using an improved multiple ion implantation process whereby multiple ion species are implanted in a pseudo-simultaneous fashion.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, thermo-electric conversion devices, and displays, such as active matrix displays. SOI structures may include a thin layer of substantially single crystal silicon on an insulating material.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si in the case of oxygen ion implantation or to separate (exfoliate) a thin Si layer to bond to another Si wafer with an oxide layer as in the case of hydrogen ion implantation.

Manufacture of SOI structures by these methods is costly. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 7,176,528 discloses a process that produces silicon on glass (SiOG) structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; (iv) cooling the structure to a common temperature; and (v) separating the glass substrate and a thin layer of silicon from the silicon wafer.

Although the manufacturing processes for making SOI structures is maturing, the commercial viability and/or application of final products employing them is limited by cost concerns. A significant cost in producing an SOI structure using the process disclosed in U.S. Pat. No. 7,176,528 is incurred during the ion implantation step. It is believed that reductions in the cost of carrying out the ion implantation process would improve the commercial application of SOI structures. Accordingly, it is desirable to continue to advance the efficiency of producing SOI structures.

Among the areas of the ion implantation process where costs are excessively high, include the resources required to prepare, and make operational, the sources of ions and the tools used for implantation. For example, when ion plasmas are employed to source ions for implantation, some type of plasma generator is required, such as an arc chamber or the like. Significant resources (time, personnel, and money) are required to make an arc chamber ready and operational. In addition, there are significant costs associated with making the semiconductor wafer (the work piece to be implanted with ions) ready to receive the ions. For example, some type of atmospheric control chamber (often called an end station) is usually employed to establish desirable conditions for implantation. These conditions may include carefully controlling vacuum, temperature, humidity, cleanliness, etc. within the chamber. Again, significant resources (time, personnel, and money) are required to make the end station ready and operational for a given ion implantation process.

The above cost issues are exacerbated when one is interested in implanting more than one species of ion into a given semiconductor wafer. Indeed, one prior art approach to multiple ion species implantation is to use a single machine approach (a single implanter set up with a single ion source) to implant one species of ion at a time. This typically involves setting up the source, accelerator equipment, and end station for one species of ion, implanting that species, and then ramping down the set up, and repeating the setup for the next species of ions. While the end station set up may remain through the transition of ion species, the transition of the ion source (including clearing the memory effect) from one species to another is very time consuming and costly.

An alternative system may employ a dual machine approach (two separate implanters, each with a dedicated ion source) to implant one species of ion at a time. This typically involves setting up both sources and accelerator equipment for both species of ion. The semiconductor wafer is placed in one of the end stations, brought to the proper atmospheric conditions, and one of the ion species is implanted. Then the semiconductor wafer is brought back to ambient conditions, transferred to the other end station, and brought back to the proper atmospheric conditions for the implantation of the second ion species. Thus, while the delays associated with transitioning a single source is reduced or eliminated, the cycling of the semiconductor wafer through two different end stations is time consuming and costly. Since transport between two end stations is required, the possibility of substrate contamination is also significantly higher in the dual machine approach.

Therefore, irrespective of which approach is employed (single or dual machine), the costs associated with preparing, and making operational, the ion sources and/or end stations used during the multiple ion species implantation processes are excessive.

There have been advancements made to the prior art approach to implanting more than one species of ion into a given semiconductor wafer. For example, one new approach is to implant both species of ions into the semiconductor wafer simultaneously. Details of this approach may be found in co-owned and co-pending U.S. Ser. No. 12/709,833, filed Feb. 2, 2010, entitled SEMICONDUCTOR STRUCTURE MADE USING IMPROVED ION IMPLANTATION PROCESS, the entire disclosure of which is incorporated herein in its entirety. While this new approach is very promising, additional research and advancements have been made, which are believed to provide reasonable alternatives, if not significant advantages, over the foregoing processes.

In an alternative prior art system, which has been manufactured by a company called Varian Inc., multiple end stations have been employed during ion implantation in order to reduce lost time associated with loading, unloading, and re-loading semiconductor wafers during ion implantation. In the Varian system, an ion beam was bent via a magnet and directed to a scanner, which was designed to produce two fanned-out ion beams. The two fanned-out ion beams were not produced simultaneously, but rather were produced in the alternative. In other words, the system was selectable in that the scanner could produce one beam or the other, but not both at the same time. One beam, if selected, was sent in one direction to an angle correction mechanism, which directed the fanned-out beam perpendicularly to a first end-station. The other beam, if selected, was sent in another direction to a separate angle correction mechanism, which directed the fanned-out beam perpendicularly to a second end-station. Thus, while the first beam was selected, the second end-station could be unloaded and re-loaded with semiconductor wafers, and vice verse. While this approach addressed some of the cost issues associated with ion implantation, it does not permit cost-effective ion implantation of multiple species of ions.

SUMMARY

Although the features, aspects and embodiments disclosed herein may be discussed in relation to the manufacture of semiconductor-on-insulator (SOI) structures, skilled artisans will understand that such disclosure need not be limited to SOI manufacturing. Indeed, the broadest protectable features, aspects, etc. disclosed herein are applicable to any process in which ion implantation into (or onto) semiconductor material is required, whether such semiconductor material is used in conjunction with an insulator or otherwise.

For ease of presentation, however, the disclosure herein may be made in relation to the manufacture of SOI structures. The specific references made herein to SOI structures are to facilitate the explanation of the disclosed embodiments and are not intended to, and should not be interpreted as, limiting the scope of the claims in any way. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures. In the context of this description, SOI may also refer to semiconductor-on-semiconductor structures, such as silicon-on-silicon structures, etc.

In accordance with one or more embodiments herein, methods and apparatus of forming a semiconductor structure, include: subjecting an implantation surface of a semiconductor wafer to an ion implantation process to create an exfoliation layer therein, wherein the ion implantation process includes implanting two different species of ions into the implantation surface of the semiconductor wafer, each species being implanted serially, but within close temporal proximity to one another.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects and features disclosed herein, there are shown in the drawings forms that are presently preferred, it being understood, however, that the covered embodiments are not limited to the precise arrangements and instrumentalities shown.

FIG. 6 is a simplified block diagram and schematic diagram of an apparatus (a dual beam implant tool) suitable for implanting a donor semiconductor wafer with ions to produce an intermediate structure useful in manufacturing the semiconductor device of FIG. 1.

DETAILED DESCRIPTION

Figure 1:
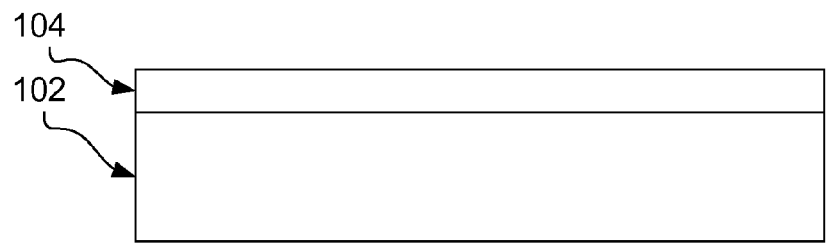
FIG. 1 is a block diagram illustrating the structure of a semiconductor device in accordance with one or more embodiments disclosed herein.

With reference to the drawings, wherein like numerals indicate like elements, there is shown in FIG. 1 a semiconductor-on-substrate structure 100 in accordance with one or more embodiments disclosed herein. In order to provide some specific context in which to discuss the broadest protectable features and aspects disclosed herein, it will be assumed that the semiconductor-on-substrate structure 100 is an SOI structure, such as a semiconductor-on-glass structure.

The SOI structure 100 may include a substrate 102, and a semiconductor layer 104. Such an SOI structure 100 may have suitable uses in connection with fabricating thin film transistors (TFTs), e.g., for display applications, including organic light-emitting diode (OLED) displays and liquid crystal displays (LCDs), integrated circuits, photovoltaic devices, etc. Although not required, the semiconductor material of the layer 104 may be in the form of a substantially single-crystal material. The word "substantially" is used in describing the layer 104 to take into account the fact that semiconductor materials normally contain at least some internal or surface defects either inherently or purposely added, such as lattice defects or a few grain boundaries. The word "substantially" also reflects the fact that certain dopants may distort or otherwise affect the crystal structure of the bulk semiconductor.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

The substrate 102, may be any desirable material exhibiting any desirable characteristics. For example, in some embodiments, the substrate 102 may be formed from a semiconductor material, such as the above-listed varieties.

In accordance with alternative embodiments, the substrate 102 may be an insulator, such as glass, an oxide glass, or an oxide glass-ceramic. As between oxide glasses and oxide glass-ceramics, the glass may have the advantage of being simpler to manufacture, thus making them more widely available and less expensive. By way of example, a glass substrate 102 may be formed from glass containing alkaline-earth ions, such as, substrates made of CORNING INCORPORATED GLASS COMPOSITION NO. 1737 or CORNING INCORPORATED GLASS COMPOSITION NO. EAGLE 2000™. These glass materials have particular use in, for example, the production of liquid crystal displays.

While the subject matter of particular interest herein involves ion implantation into semiconductor material, it is believed that providing some additional context in terms of a specific process for manufacturing the SOI 100 is beneficial. Thus, reference is now made to FIGS. 2-5, which illustrate a general process (and resultant intermediate structures) within which the aforementioned ion implantation may be carried out in order to manufacture the SOI structure 100 of FIG. 1.

Figure 2:
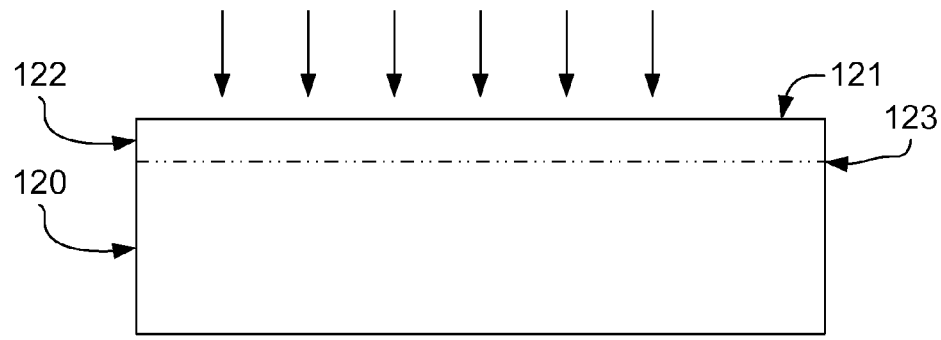
FIGS. 2-5 are schematic diagrams illustrating intermediate structures formed using processes of manufacturing the semiconductor device of FIG. 1.

Turning first to FIG. 2, a donor semiconductor wafer 120 is prepared, such as by polishing, cleaning, etc. to produce a relatively flat and uniform implantation surface 121 suitable for bonding to the substrate 102, e.g., a glass or glass-ceramic substrate. For the purposes of discussion, the semiconductor wafer 120 may be a substantially single crystal Si wafer, although as discussed above any other suitable semiconductor conductor material may be employed.

An exfoliation layer 122 is created by subjecting the implantation surface 121 to an ion implantation process to create a weakened region 123 below the implantation surface 121 of the donor semiconductor wafer 120. Although it is this ion implantation process that is the focus of the disclosure herein, at this point only general reference will be made to the process for creating the weakened region 123. Later in this description, however, a more detailed discussion of one or more ion implantation processes of specific interest will be provided. The ion implantation energy may be adjusted using to achieve a general thickness of the exfoliation layer 122, such as between about 300-500 nm, although any reasonable thickness may be achieved. The effect of ion implantation into the donor semiconductor wafer 120 is the displacement of atoms in the crystal lattice from their regular locations. When the atom in the lattice is hit by an ion, the atom is forced out of position and a primary defect, a vacancy and an interstitial atom, is created, which is called a Frenkel pair. If the implantation is performed near room temperature, the components of the primary defect move and create many types of secondary defects, such as vacancy clusters, etc.

Figure 3:
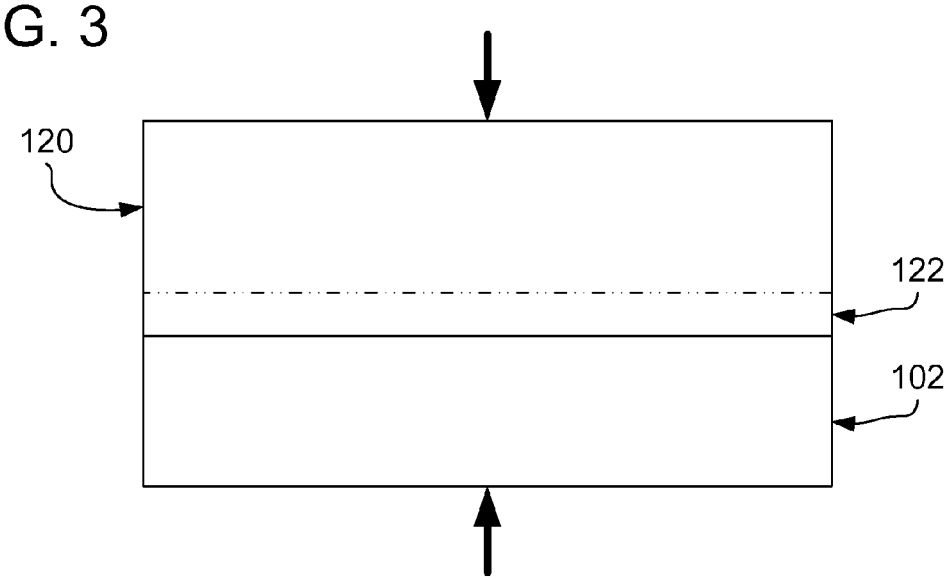

With reference to FIG. 3, the substrate 102 may be bonded to the exfoliation layer 122 using an electrolysis process (also referred to herein as an anodic bonding process). A basis for a suitable electrolysis bonding process may be found in U.S. Pat. No. 7,176,528, the entire disclosure of which is hereby incorporated by reference. Portions of this process are discussed below; however, one or more embodiments described herein are directed to modifications of the ion implantation process of U.S. Pat. No. 7,176,528.

In the bonding process, appropriate surface cleaning of the substrate 102 (and the exfoliation layer 122 if not done already) may be carried out. Thereafter, the intermediate structures are brought into direct or indirect contact. The resulting intermediate structure is thus a stack, including the bulk material layer of the donor semiconductor wafer 120, the exfoliation layer 122, and the glass substrate 102.

Prior to or after the contact, the stack of the donor semiconductor wafer 120, the exfoliation layer 122, and the glass substrate 102 is heated (indicated by the arrows in FIG. 3). The glass substrate 102 and the donor semiconductor wafer 120 are taken to a temperature sufficient to induce ion migration within the stack and an anodic bond therebetween. The temperature is dependent on the semiconductor material of the donor wafer 120 and the characteristics of the glass substrate 102. By way of example, the temperature of the junction may be taken to within about +/−350° C. of a strain point of the glass substrate 102, more particularly between about −250° C. and 0° C. of the strain point, and/or between about −100° C. and −50° C. of the strain point. Depending on the type of glass, such temperature may be in the range of about 500-600° C.

In addition to the above-discussed temperature characteristics, mechanical pressure (indicated by the arrows in FIG. 3) is applied to the intermediate assembly. The pressure range may be between about 1 to about 50 psi. Application of higher pressures, e.g., pressures above 100 psi, might cause breakage of the glass substrate 102.

A voltage (indicated by the arrows in FIG. 3) is also applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. More particularly, positive ions of the glass substrate 102, including substantially all modifier positive ions, migrate away from the higher voltage potential of the donor semiconductor wafer 120, forming: (1) a reduced positive ion concentration layer in the glass substrate 102 adjacent the exfoliation layer 122; and (2) an enhanced positive ion concentration layer of the glass substrate 102 adjacent the reduced positive ion concentration layer. This formation results in barrier functionality, i.e., preventing positive ion migration back from the oxide glass or oxide glass-ceramic, through the reduced positive ion concentration layer, and into the semiconductor layer.

Figure 4:
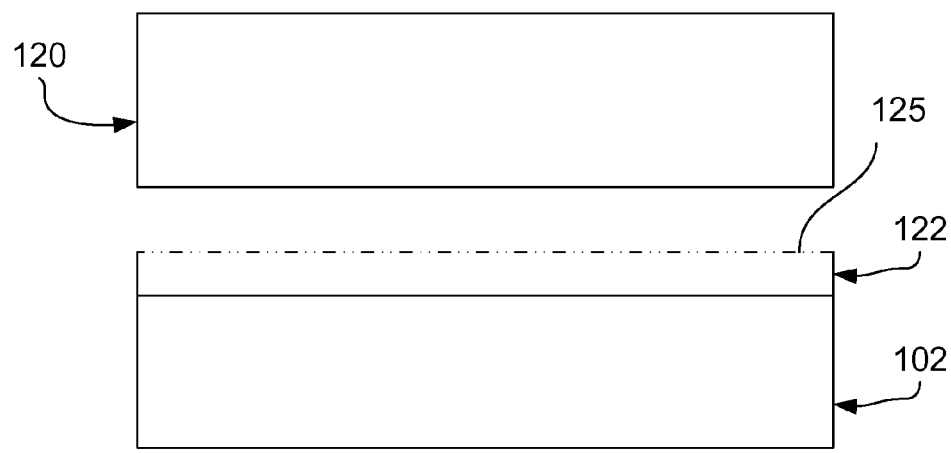
Figure 5:
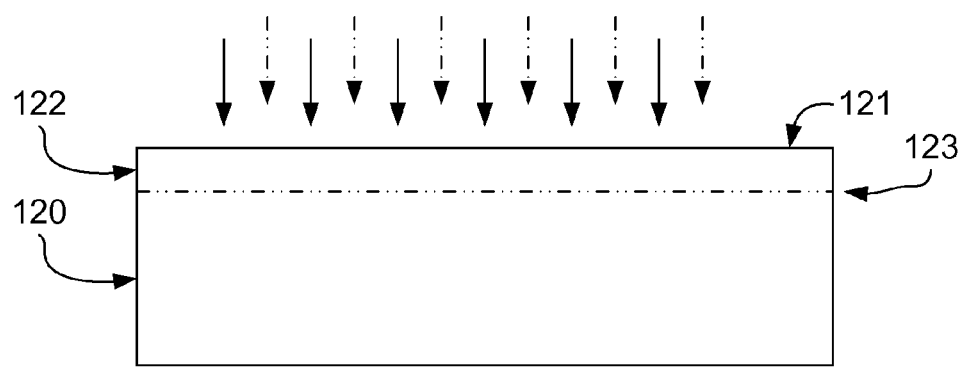

With reference to FIG. 4, after the intermediate assembly is held under the conditions of temperature, pressure and voltage for a sufficient time, the voltage is removed and the intermediate assembly is allowed to cool to room temperature. At some point during heating, during a dwell, during cooling, and/or after cooling, the donor semiconductor wafer 120 and the glass substrate 102 are separated. This may include some peeling if the exfoliation layer 122 has not already become completely free from the donor 120. The result is a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

The cleaved surface 125 of the SOI structure 100, just after exfoliation, may exhibit surface roughness, excessive silicon layer thickness, and/or implantation damage of the silicon layer (e.g., due to the formation of an amorphized silicon layer). Depending on the implantation energy and implantation time, the thickness of the exfoliation layer 122 may be on the order of about 300-500 nm, although other thicknesses may also be suitable. These characteristics may be altered using post bonding processes in order to advance from the exfoliation layer 122 and produce the desirable characteristics of the semiconductor layer 104 (FIG. 1). It is noted that the donor semiconductor wafer 120 may be reused to continue producing other SOI structures 100.

Reference is now made to FIG. 5, which is again directed to the creation of the exfoliation layer 122 by subjecting the implantation surface 121 of the donor semiconductor wafer 120 to an ion implantation process to create the weakened region 123 below the implantation surface 121 of the donor semiconductor wafer 120. In accordance with one or more embodiments, the ion implantation process includes implanting two different species of ions into the implantation surface 121 of the donor semiconductor wafer 120. In accordance with preferred aspects, the two different species of ions are implanted one after the other, serially, using an improved apparatus and process.

With reference to FIG. 6, the implantation of the two different types of ions may be carried out in a multiple beam implant tool 150. Although a preferred implementation includes two simultaneous ion beams (as shown), those skilled in the art will appreciate that the inventive aspects may be extended to produce tools with more beams, such as three or more beams. The tool 150 may be purchased commercially and then modified to achieve the process described herein, or a substantially new tool may be developed. As the design and operating principle of implant tools may differ, the specific modifications in equipment and/or operation will be left to the skilled artisan, but should be based on the description herein.

The ion implant tool 150 of FIG. 6 is illustrated in high-level schematic form and includes a source 152 of plasma, which simultaneously produces first plasma (including a first species of ions) and second plasma (including a second, differing, species of ions). This functionality of the source 152 is illustrated by way of two inputs 202, 204, which represent the precursor sources of differing ions.

Figure 7A:
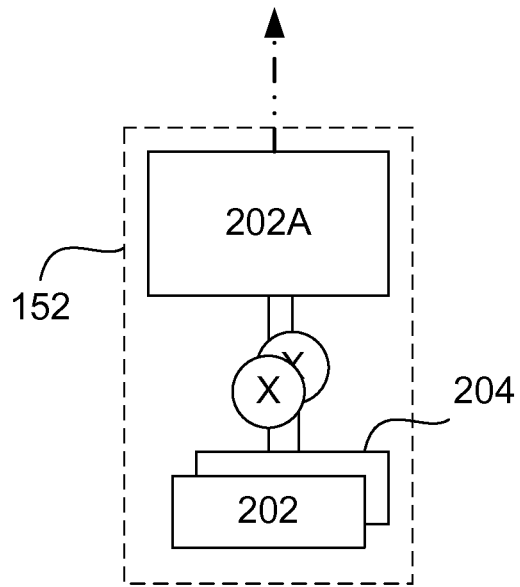
FIGS. 7A-7B illustrate respective embodiments of a source of plasma, which simultaneously produces first plasma (including a first species of ions) and second plasma (including a second, differing, species of ions).
Figure 7B:
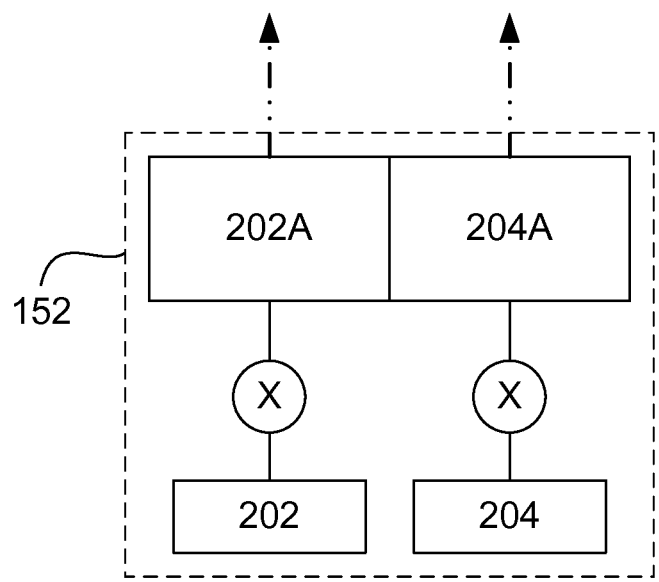

With reference to FIGS. 7A and 7B, the source 152 may be implemented in any number of ways. For example, with reference to FIG. 7A, the source 152 may include first and second sources of gas vapor, e.g. a first tank 202 and a second tank 204, each feeding a single chamber 202A. The gas vapor is required for plasma generation in the chamber 202A. The tanks 202 may contain gases, liquids or solids. For liquids and solids a level of heating is required to generate the gas vapor. The respective gas flows from the tanks 202 are controlled via needle valves or mass-flow controllers. The gases, liquids or solids within the tanks 202, 204 include a respective species of atoms and/or molecules. By way of example, the first tank 202 may contain atoms and/or molecules of hydrogen, and the second tank 204 may contain atoms and/or molecules of helium. Other atom/molecule species are also possible, such as being taken from the group consisting of: boron, hydrogen, helium, and/or other suitable species of atoms and/or molecules.

In an alternative configuration, the source 152 of FIG. 7A may not include both tanks of gas 202, 204, but instead may employ a single tank containing both species of atoms and/or molecules, e.g., hydrogen and helium mixed within the tank.

In accordance with one or more embodiments, the chamber 202A may include the structural elements necessary to produce plasma from the input gas. For example, the first chamber 202A may be implemented as an arc chamber, which includes the magnets, filaments, reflectors, energy sources, etc. necessary to receive the gas from the tanks 202, 204 (or the single tank) and produce plasma. It is understood, however, that any other suitable and known technique for producing plasma from gas may additionally or alternatively be employed. In this embodiment, the single chamber produces a single stream of plasma, containing the first and second plasma (i.e., containing both species of ions). It is understood that those skilled in the art are well aware of the basic structural elements necessary to produce plasma from gas within an arc chamber. Those skilled in the art will appreciate that, depending on the species of atoms and/or molecules within the gas, the resulting plasma may include differing types of ions, while still being within a species. For example, in the case of hydrogen, the plasma may include H ions, $H_2$ ions, and $H_3$ ions. In the case of helium, the plasma may include substantially only $He_4$ ions. In a combined plasma stream of both the first and second plasma, the stream will include both ion species, for example, H ions, $H_2$ ions, $H_3$ ions, and $He_4$ ions.

With reference to FIG. 7B, an alternative embodiment of the source 152 may include the first and second sources of gas, e.g. the first tank 202 and the second tank 204, each feeding a respective chamber 202A, 204A. In accordance with this embodiment, both of the respective chambers 202A, 204A include the magnets, filaments, reflectors, energy sources, etc. necessary to receive the gas from the respective tank 202, 204 and produce two, separate streams of plasma, the first plasma and the second plasma. Thus, the first plasma, which includes a first species of ions, may be produced within the first chamber 202A, and the second plasma, which includes a second, differing, species of ions, may be produced within the second chamber 204A.

As discussed above, those skilled in the art will appreciate that there is a substantial amount of time needed to ramp up a chamber from a cold start to a status suitable for producing high density plasma. Indeed, set up time includes adjustments for the species of ion, and the magnets, filaments, reflectors, energy sources, etc. must all ramp up and settle into proper conditions for plasma generation. As will be discussed further herein, when a single chamber 202A is used to produce a single stream of plasma (containing both species of ions) there is only one set up time (which may include the associated memory effects), and no time is lost switching over from one species of ion to another. When multiple chambers 202A, 204A are employed, each of the chambers may be simultaneously ramped up and each may produce plasma at the same time. Again, there is effectively only one set up time (both chambers being set up in parallel), and no time is lost switching over from one species of ion to another (which eliminates the delays associated with ramping up, including the memory effects). This permits rapid delivery of the differing species of ions to the semiconductor wafer 120 during ion implantation, thereby resulting in significant cost saving advantages, which will be discussed further with relation to other aspects of the system 150 that have yet to be presented.

The source 152 is in communication with the next phase of the system 150, which is an accelerator system 170. The output of the source 156 (whether a combined plasma stream or two separate streams) is in communication with an input (or inlet) 172 of the accelerator system 170. The accelerator system 170 simultaneously accelerates the first and second plasma along an initial axis, A0, from the source 152. More specifically, the accelerator system 170 includes any number of electrodes, two such electrodes 208, 210 being shown by way of example. An appropriate voltage potential (which may be in the range of 10's to 100's of K volts) between the electrodes 208, 210 will cause the first and second plasma to accelerate toward and through the analyzer magnet 180.

The analyzer magnet 180 alters the trajectory of the ions within the plasma. The change in trajectory of the ions within the first and second plasma will depend on a number of factors, including the strength of the magnetic field produced by the analyzer magnet 180, the mass/charge ratio of the ions, the acceleration magnitude of the ions as they pass through the magnet 180, etc., all of which are known in the art.

The accelerator system 170 applies the same electric field (of a given magnitude) to both the first and second plasma, thereby accelerating the respective first and second species of ions to velocities that exhibit differing momentum. Indeed, recall that whether the first and second plasma is in a single stream of in separate streams, once they are in the accelerator system 170, the electric field is applied to all the ions, which include, for example, H ions, $H_2$ ions, $H_3$ ions, and $He_4$ ions.

Each of these types of ions is of a differing mass, and therefore each of the types of ions will achieve a different momentum (whether of differing velocity or not) through the analyzer magnet 180.

The analyzer magnet 180 applies a given magnetic field to both the first and second species of ions. Since the different species of ions have different momentums, the given magnetic force alters the trajectories of the respective first and second species of ions by differing amounts. Thus, the analyzer magnet 180 alters the trajectory of the first species of ions from the first plasma, producing at least one first ion beam along a first axis, A1, which is transverse to the initial axis, A0. Simultaneously, the analyzer magnet 180 alters the trajectory of the second species of ions from the second plasma, producing at least one second ion beam along a second axis, A2, which is transverse to the initial axis A0 and the first axis A1. Even within a species, such as hydrogen ions, there may be differing numbers of atomic bonds between atoms and thus, the resulting H ions, $H_2$ ions, and $H_3$ ions will each have a differing momentum. Likewise, the $He_4$ ions will have a different momentum than the hydrogen ions. Thus, the H ions, $H_2$ ions, $H_3$ ions, and $He_4$ ions leave the analyzer magnet 180 at differing trajectories. For purposes of example, it is assumed that the desired ion species for implanting the semiconductor wafer 120 are $H_2$ ions and $He_4$ ions, the electric field, magnetic force, etc. are set such that the $H_2$ ions attain the trajectory along the first axis A1 and the $He_4$ ions attain the trajectory along the second axis A2.

The system 150 includes a beam processing system 250 operating to simultaneously direct the first and second ion beams toward the semiconductor wafer 120 such that the first and second species of ions bombard the implantation surface 121 of the semiconductor wafer 120 to create the exfoliation layer 122 therein.

The beam processing system 250 includes a mass resolution system 252, which includes a number of slits, at least one slit for each species of ions to be delivered to the semiconductor wafer 120. In the illustrated example, there are two such slits 252A, and 252B. The slit 252A is positioned to permit the first ion beam traveling along axis A1 to pass therethrough. The slit 252B is positioned to permit the second ion beam traveling along axis A2 to pass therethrough. The other trajectories of the ions not being used cause the respective beams to terminate into full stops, such as the beam traveling along axis A3. In keeping with the examples discussed above, the beam traveling along axis A3 might be $H_3$.

The beam processing system 250 also includes a scanner system, which includes a plurality of scanner elements, two scanner elements 254A, 254B being shown in this example. The first scanner element 254A receives the first ion beam along the first axis A1 and fans the first ion beam out 256A in one dimension (e.g., in one plane). Similarly, the second scanner element 254B receives the second ion beam along the second axis A2 and fans the second ion beam out 256B in similar dimension. The respective scanner elements 254A, 254B are in communication with respective angle correction elements 258A, 258B. The first angle correction element 258A operates to receive the fanned first ion beam 256A and re-direct same 260A in a direction substantially perpendicular (or other chosen angle) to the implantation surface 121 of the semiconductor wafer 120. Similarly, the second angle correction element 258B operates to receive the fanned second ion beam 256B and re-direct same 260B in a direction also substantially perpendicular (or other chosen angle) to the implantation surface 121 of the semiconductor wafer 120.

Notably, the first and second beams 260A, 260B are simultaneously delivered toward the semiconductor wafer 120, however, as will be discussed below, they may not be simultaneously incident on the location of the implantation surface 121 of the semiconductor wafer 120 at the same time, but rather incident serially on a given portion of the semiconductor wafer 120. In this regard, the beam processing system 250 may further include some acceleration mechanisms (not shown) to accelerate at least one of: the first ion beam along A1, the second ion beam along A2, the first fanned ion beam 256A, the second fanned ion beam 256B, the first re-directed beam 260A, and the second re-directed beam 260B, toward the semiconductor wafer 120. Only one ion beam (one for each ion specie) needs to be adjusted (typically reduced) so that the desired dose for each implanted specie is correctly maintained for the scans required to complete the slowest implant time.

Individual ion beam energies are maintained by providing specific and separate ion acceleration forces (e.g., via the aforementioned acceleration mechanisms) for each ion beam within the beam processing system 250 (post analyzer magnet 180).

The system 150 also includes an end station 190 operating to support and translate the semiconductor wafer 120 such that the first and second species of ions, separately and serially, bombard the implantation surface 121 to create the exfoliation layer 122 therein. The end station 190 includes a transport mechanism 212, which permits the semiconductor wafer 120 to translate, or scan, (see the bi-directional arrow) in appropriate directions, such that the respective ion beams paint the semiconductor wafer 120 and suitable target doses (one for each ion species) are achieved. In an alternative end station configuration, rotating process disks may be employed to rotate the semiconductor wafer 120 through the ion beams, as opposed to the relatively linear translation of the semiconductor wafer shown in FIG. 6.

The end station 190 also operates to maintain a controlled atmosphere within which the semiconductor wafer 120 is disposed during implantation. Preferably, the atmosphere includes a suitable vacuum, temperature, humidity, cleanliness, etc. In this regard, the end station 190 includes an input in communication with the output from the accelerator system 170, whereby the ion beams 260A, 260B may be received, but the controlled atmosphere is not lost.

The end station 190 operates to maintain the semiconductor wafer 120 within the controlled atmosphere during the implantation of the first ion species 260A, and during a subsequent implantation of the second ion species 260B.

The ability to implant two differing species of ions in parallel, each at chosen implant recipes, saves considerable time, and reduces production costs. Further, the single or multiple chambers 202A, 204A are operating during the entire implantation process, which results in very significant cost and time savings.

While the above embodiments have been discussed with specific reference to the structure of the tool 150, one skilled in the art will appreciate that inventive aspects apply to one or more processes as well.

In this regard, a method of forming a semiconductor structure may include: providing a first source of plasma (first plasma), which includes a first species of ions; providing a second source of plasma (second plasma), which includes a second, differing, species of ions; simultaneously accelerating the first and second plasma along an initial axis; altering a trajectory of the first species of ions from the first plasma, thereby producing at least one first ion beam along a first axis, which is transverse to the initial axis; altering a trajectory of the second species of ions from the second plasma, thereby producing at least one second ion beam along a second axis, which is transverse to the initial axis and the first axis; and simultaneously directing the first and second ion beams toward a semiconductor wafer such that the first and second species of ions serially bombard an implantation surface of the semiconductor wafer to create an exfoliation layer therein.

The method may include supporting and translating the semiconductor wafer such that the first and second species of ions, separately and serially, bombard the implantation surface of the semiconductor wafer to create the exfoliation layer therein. The method may include translating the semiconductor wafer through the first ion beam and thereafter translating the semiconductor wafer through the second ion beam. The semiconductor wafer is maintained in a controlled atmosphere during implantation.

The method may further include fanning the first ion beam along the first axis into a fanned first ion beam, and re-directing the first ion beam from the first axis to a direction substantially perpendicular to (or at another chosen incident angle) the implantation surface of the semiconductor wafer. Similarly, the method may include fanning the second ion beam along the second axis into a fanned second ion beam, and re-directing the second ion beam from the second axis to the direction substantially perpendicular to (or at another chosen incident angle) the implantation surface of the semiconductor wafer.

Although the aspects, features, and embodiments disclosed herein have been described with reference to particular details, it is to be understood that these details are merely illustrative of broader principles and applications. It is therefore to be understood that numerous modifications may be made to the illustrative embodiments and that other arrangements may be devised without departing from the spirit and scope of the appended claims.

The invention claimed is:

1. An apparatus, comprising:
a source simultaneously producing first plasma, which includes a first species of ions, and second plasma, which includes a second, differing, species of ions;
an accelerator system including an analyzer magnet, which cooperate to simultaneously: (i) accelerate the first and second plasma along an initial axis, (ii) alter a trajectory of the first species of ions from the first plasma, thereby producing at least one first ion beam along a first axis, which is transverse to the initial axis, and (iii) alter a trajectory of the second species of ions from the second plasma, thereby producing at least one second ion beam along a second axis, which is transverse to the initial axis and the first axis; and
a beam processing system operating to simultaneously direct the first and second ion beams toward a semiconductor wafer such that the first and second species of ions bombard an implantation surface of the semiconductor wafer to create an exfoliation layer therein.

2. The apparatus of claim 1, wherein the first and second plasma are one of: combined into a single stream of plasma, and separate streams of plasma.

3. The apparatus of claim 1, further comprising: an end station operating to support and translate the semiconductor wafer such that the first and second species of ions, separately and serially, bombard the implantation surface of the semiconductor wafer to create the exfoliation layer therein.

4. The apparatus of claim 2, wherein at least one of:
the end station translates the semiconductor wafer through the first ion beam and thereafter the end station translates the semiconductor wafer through the second ion beam; and
the end station operates to maintain a controlled atmosphere within which the semiconductor wafer is disposed during implantation.

5. The apparatus of claim 1, wherein:
the accelerator system applies an electric field of a given magnitude to both the first and second plasma, thereby accelerating the respective first and second species of ions to differing velocities; and
the analyzer magnet system applies a given magnetic field to both the first and second species of ions, thereby altering trajectories of the respective first and second species of ions by differing amounts to attain the transverse first and second axes of direction.

6. The apparatus of claim 5, further comprising:
a first scanner element operating to receive the first ion beam along the first axis and to fan the first ion beam out; and
a second scanner element operating to receive the second ion beam along the second axis and to fan the second ion beam out.

7. The apparatus of claim 6, further comprising:
a first angle correction element operating to receive the fanned first ion beam and re-direct same in a selected direction substantially toward the implantation surface of the semiconductor wafer; and
a second angle correction element operating to receive the fanned second ion beam and re-direct same in a selected direction substantially toward the implantation surface of the semiconductor wafer.

8. The apparatus of claim 1, wherein the beam processing system further operates to accelerate at least one of: the first ion beam, the second ion beam, the first fanned ion beam, the second fanned ion beam, the first re-directed beam, and the second re-directed beam, toward the semiconductor wafer.

9. The apparatus of claim 1, wherein the source of plasma includes:
a source of a first species of atoms and/or molecules in communication with a first chamber, the first chamber operating to produce the first plasma from the first species of atoms and/or molecules; and
a source of a second species of atoms and/or molecules in communication with a second chamber, the second chamber operating to produce the second plasma from the second species of atoms and/or molecules.

10. The apparatus of claim 9, wherein sources of the first and second species of atoms and/or molecules are separate containers of gas.

11. The apparatus of claim 1, wherein the source of plasma includes:
a source of a first species of atoms and/or molecules in communication with a chamber; and
a source of a second species of atoms and/or molecules in communication with the chamber,
wherein the chamber operates to produce the first and second plasma from the first and second species of atoms and/or molecules.

12. The apparatus of claim 11, wherein sources of the first and second species of atoms and/or molecules are separate containers of gas.

13. The apparatus of claim 1, wherein the first and second species of ions are taken from the group consisting of: boron, hydrogen, and helium.

14. A method of forming a semiconductor structure, comprising:
providing a first source of plasma (first plasma), which includes a first species of ions;

providing a second source of plasma (second plasma), which includes a second, differing, species of ions;

simultaneously accelerating the first and second plasma along an initial axis;

altering a trajectory of the first species of ions from the first plasma, thereby producing at least one first ion beam along a first axis, which is transverse to the initial axis;

altering a trajectory of the second species of ions from the second plasma, thereby producing at least one second ion beam along a second axis, which is transverse to the initial axis and the first axis; and simultaneously directing the first and second ion beams toward a semiconductor wafer such that the first and second species of ions serially bombard an implantation surface of the semiconductor wafer to create an exfoliation layer therein.

15. The method of claim 14, further comprising: supporting and translating the semiconductor wafer such that the first and second species of ions, separately and serially, bombard the implantation surface of the semiconductor wafer to create the exfoliation layer therein.

16. The method of claim 15, further comprising translating the semiconductor wafer through the first ion beam and thereafter translating the semiconductor wafer through the second ion beam.

17. The method of claim 16, further comprising maintaining the semiconductor wafer in a controlled atmosphere during implantation.

18. The method of claim 14, further comprising:
fanning the first ion beam along the first axis into a fanned first ion beam; and
fanning the second ion beam along the second axis into a fanned second ion beam.

19. The method of claim 14, further comprising:
re-directing the first ion beam from the first axis to a selected direction substantially toward the implantation surface of the semiconductor wafer; and
re-directing the second ion beam from the second axis to the selected direction substantially toward the implantation surface of the semiconductor wafer.

20. The method of claim 14, wherein the first and second species of ions are taken from the group consisting of: boron, hydrogen, and helium.

* * * * *